(12) United States Patent
Li et al.

(10) Patent No.: US 9,436,885 B2
(45) Date of Patent: Sep. 6, 2016

(54) DETERMINING A COMPUTER'S POSITION AND SYSTEM FOR MANUFACTURING A TAG

(75) Inventors: Yan Li, Beijing (CN); Hai Bo Lin, Beijing (CN); Tao Liu, Beijing (CN); Yu Dong Yang, Beijing (CN); Yi Xin Zhao, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 645 days.

(21) Appl. No.: 13/558,969

(22) Filed: Jul. 26, 2012

(65) Prior Publication Data

US 2013/0027529 A1 Jan. 31, 2013

(30) Foreign Application Priority Data

Jul. 28, 2011 (CN) .......................... 2011 1 0213635

(51) Int. Cl.
*H04N 7/18* (2006.01)
*G06K 9/32* (2006.01)
*G06K 9/26* (2006.01)

(52) U.S. Cl.
CPC .............. *G06K 9/3233* (2013.01); *G06K 9/26* (2013.01)

(58) Field of Classification Search
CPC ...... G06K 9/26; G06K 9/3233; B05B 15/00; H04N 7/18
USPC ............. 348/61, 64, 68, 73–734, 80, 86, 87, 348/94–95
See application file for complete search history.

(56) References Cited

U.S. PATENT DOCUMENTS

| 8,060,241 | B2 | 11/2011 | Ishida et al. | |
| 2007/0250410 | A1* | 10/2007 | Brignone et al. | ............... 705/28 |
| 2008/0317021 | A1 | 12/2008 | Ives et al. | |
| 2009/0024764 | A1 | 1/2009 | Atherton et al. | |
| 2009/0109031 | A1 | 4/2009 | Calvin et al. | |
| 2009/0282140 | A1* | 11/2009 | White et al. | ................... 709/223 |
| 2010/0019905 | A1 | 1/2010 | Boddie et al. | |
| 2011/0084839 | A1 | 4/2011 | Groth et al. | |
| 2011/0218730 | A1* | 9/2011 | Rider et al. | ................... 701/201 |
| 2012/0025988 | A1 | 2/2012 | Harada | |
| 2012/0206592 | A1 | 8/2012 | Gerst, III et al. | |
| 2014/0203103 | A1* | 7/2014 | Pitman | ............................ 239/71 |

FOREIGN PATENT DOCUMENTS

| CN | 101960324 A | 1/2011 |
| CN | 102135429 A | 7/2011 |
| WO | WO 2011/025530 A1 | 3/2011 |

OTHER PUBLICATIONS

Cole, "Data Center Management", No Limits Software White Paper #1, 2010, http://www.nolimitssoftware.com/docs/ITAsseManagementWhitePaper.pdf, pp. 1-15. "Improve Data Security and IT Asset Visibility With RFID", Motorola, Inc., 1301 East Algonquin Road, Schaumburg, IL 60196, Printed Oct. 2010, http://www.motorola.com/web/Business/_Documents/Application%20Briefs/Static%20Files/RFID%20AB%20FINAL.pdf?localeId=33.
Office Action dated Nov. 24, 2014, from the corresponding Chinese application.
US Official Action dated Feb. 23, 2015 from related U.S. Appl. No. 13/614,960.

* cited by examiner

*Primary Examiner* — Paulos M Natnael
(74) *Attorney, Agent, or Firm* — Scully, Scott, Murphy & Presser, P.C.; Jennifer Davis, Esq.

(57) ABSTRACT

A system and method for accurately positioning a computer position, and identifying the specific rack position where the computer is without manual intervention. A camera is installed on the computer to read the contents of a tag on the rack, so as to identify the position information of the computer. Specifically, the computer is provided with a self-positioning function, wherein: a camera is installed on the computer, and the camera is configured to read the contents of a tag attached on a side of a rack to house the computer to identify the rack position where the computer is.

13 Claims, 9 Drawing Sheets

#050207 # #050207 # #050207 # #050207 # #
Fig. 5A
Fig. 5B
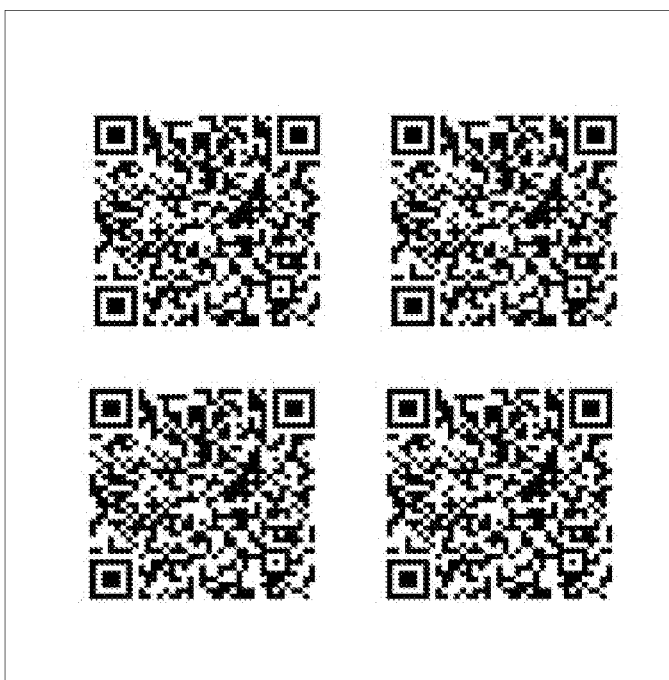
Fig. 5C

DETERMINING A COMPUTER'S POSITION AND SYSTEM FOR MANUFACTURING A TAG

CROSS-REFERENCE TO RELATED APPLICATIONS

The present invention relates to and claims the benefit of the filing date of commonly-owned, co-pending Chinese Patent Application No. CN 201110213635.6, filed on Jul. 28, 2011, the entire contents and disclosure of which is incorporated by reference as if fully set forth herein.

TECHNICAL FIELD

The present invention generally relates to a method and system for processing data, particularly, the present invention relates to a computer with a self-positioning function, a method for determining a computer's position and a system for manufacturing a tag for determining a rack position.

BACKGROUND OF THE INVENTION

The number of servers in a data center is usually enormous, from thousands, tens of thousands to hundreds of thousands or even more, and it is a problem that needs to be solved for each data center as to how to manage the servers in the data center, more particularly, how to determine the position of each server in the data center, and to know in time position changes of each server.

To solve this difficult problem, there are generally two solutions: one is to manually record the position of each server and changes of the position, and the other is to position each server by the radio frequency identification (RFID) technology. For the first solution, manual entry and registration is time consuming and has a high error rate, and it is not practical for the management of a large data center. The second solution may include two sub-solutions. According to the first sub-solution, an active tag may be installed on each server to actively send signals of a certain frequency, and an RFID reader may be installed on the rack of the data center to read and decode the information and then to send it to a central information system to perform related data processing. In the second sub-solution, an RFID tag is installed on the rack, the tag having stored therein the information of a corresponding physical position, and an RFID reader is installed on each server. After the server powers on, the reader will automatically scan the RFID tag to determine the position of the current server and store the result.

However, no matter what kind of the above RFID solutions is used, using the RFID technology to position servers can not realize accurate positioning, that is, since the RFID reader has a relatively remote reading distance, it can hardly know accurately the position of each server, rather, it can only know roughly the region where a server is. In addition, the implementation cost of the RFID technology is high, and it is very difficult to be applied in an actual application.

SUMMARY OF THE INVENTION

The present invention provides a solution for accurately positioning a computer's position, that is to say, the present invention can identify the specific rack position where the computer is, and the present invention is low-cost and does not need manual intervention. The core idea of the present invention is to use the camera installed on the computer to read the contents of a tag on the rack to recognize the position information of the computer.

Specifically, the present invention provides a computer with a self-positioning function, wherein: a camera is installed on the computer, and the camera is configured to read contents of a tag attached on one side of a rack which houses the computer to identify the rack position where the computer is.

According to an embodiment of the present invention, the camera is installed on one side of the computer opposite to the one side of the rack, and the bottom side of the lens of the camera is parallel to the one side of the computer.

The present invention also provides a method for determining the position of a computer on a rack, comprising: turning on a camera on the computer; using the camera to read contents of a tag attached on a side of the rack to recognize the rack position where the computer is.

The present invention also provides a system for manufacturing a tag for determining a rack position, the system comprising: position information receiving means configured to receive input of the position information of at least one rack position, wherein the rack is for housing a computer; and tag creating means configured to, based on the input position information, create a tag to identify at least one rack position, wherein the tag is to be installed on a side of the rack so that the camera on the computer can read the contents of the tag to determine the rack's position where the computer is.

According to an embodiment of the present invention, the system for manufacturing a tag for determining a rack position further comprises encoding means configured to encode the position information of at least one rack position.

BRIEF DESCRIPTION OF THE ACCOMPANYING DRAWINGS

The accompanying drawings referred to by the present description are only for exemplifying typical embodiments of the present invention, and should not be construed as limitation to the scope of the present invention.

FIG. 5A shows a schematic view of using text information as tag contents according to an embodiment of the present invention.

FIG. 5B shows a schematic view of using one-dimensional code as tag contents according to another embodiment of the present invention.

FIG. 5C shows a schematic view of using two-dimensional code as tag contents according to yet another embodiment of the present invention.

BEST MODES FOR CARRYING OUT THE INVENTION

Figure 1:
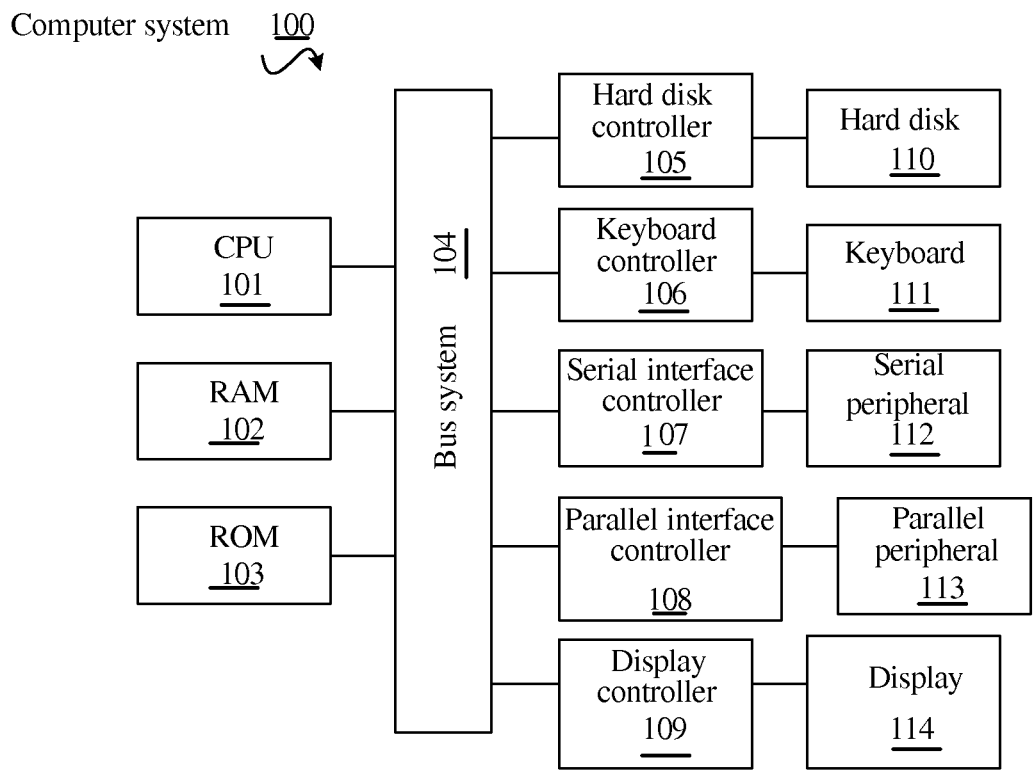
FIG. 1 shows a block diagram of an exemplary computing system 100 suitable for realizing an embodiment of the present invention.

The terminology used herein is for the purpose of describing particular embodiments only and is not intended to be unduly limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of embodiments of the present invention has been presented for purposes of illustration and description, but is not intended to be exhaustive or limited to the form disclosed. Many modifications and variations will be apparent to those of ordinary skill in the art. The embodiment was chosen and described in order to best explain the principles and the practical application, and to enable others of ordinary skill in the art to understand various embodiments of the invention with various modifications as are suited to the particular use contemplated.

As will be appreciated by one skilled in the art, embodiments of the present invention may be embodied as a system, method or computer program product. Accordingly, embodiments of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, various aspects of the present invention may take the form of a computer program product embodied in one or more computer readable mediums containing computer-usable program code.

Any combination of one or more computer readable medium(s) may be utilized. The computer readable medium may be a computer readable signal medium or a computer readable storage medium. The computer readable storage medium may be, for example but not limited to, an electronic, magnetic, optical, electromagnetic, infrared, or semiconductor system, apparatus, device, or any combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any combination of the foregoing. In the context of this document, a computer-readable medium may be any medium that can contain or store a program for use by or in connection with the instruction execution system, apparatus, or device.

The computer readable signal medium may include a propagated data signal with the computer readable program code embodied therewith, either in baseband or as part of a carrier wave. The transmitted propagated signal may take various forms including but not limited to, electro-magnetic signal, optical signal, or any suitable combination thereof. The computer readable signal medium may be any computer readable medium that is not a computer readable storage medium and that can communicate, propagate, or transport a program for use by or in connection with an instruction execution system, apparatus, or device.

The program code embodied on the computer readable medium may be transmitted using any appropriate medium, including but not limited to wireless, wire line, optical fiber cable, (RF), etc., or any suitable combination thereof.

Computer program code for holding out operations in embodiments of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

FIG. 1 schematically shows a block diagram of a computing system 100 that can realize an embodiment of the present invention. As shown, the computer system 100 may comprise CPU (central processing unit) 101, RAM (random access memory) 102, ROM (read-only memory) 103, system bus 104, hard disc controller 105, keyboard controller 106, serial interface controller 107, parallel interface controller 108, display controller 109, hard disc 110, keyboard 111, serial peripheral device 112, parallel peripheral device 113 and display 114. In these components, CPU 101, RAM 102, ROM 103, hard disc controller 105, keyboard controller 106, serial interface controller 107, parallel interface controller 108 and display controller 109 are connected with system bus 104. Hard disc 110 is connected with hard disc controller 105; keyboard 111 is connected with keyboard controller 106; serial peripheral device 112 is connected with serial interface controller 107; parallel peripheral device 113 is connected with parallel interface controller 108, and display 114 is connected with display controller 109. It should be understood that the structural block diagram shown in FIG. 1 is only shown as an example, rather than limitation to the scope of the present invention. In some situations, some devices may be added or removed as required by specific conditions.

Figure 2A:
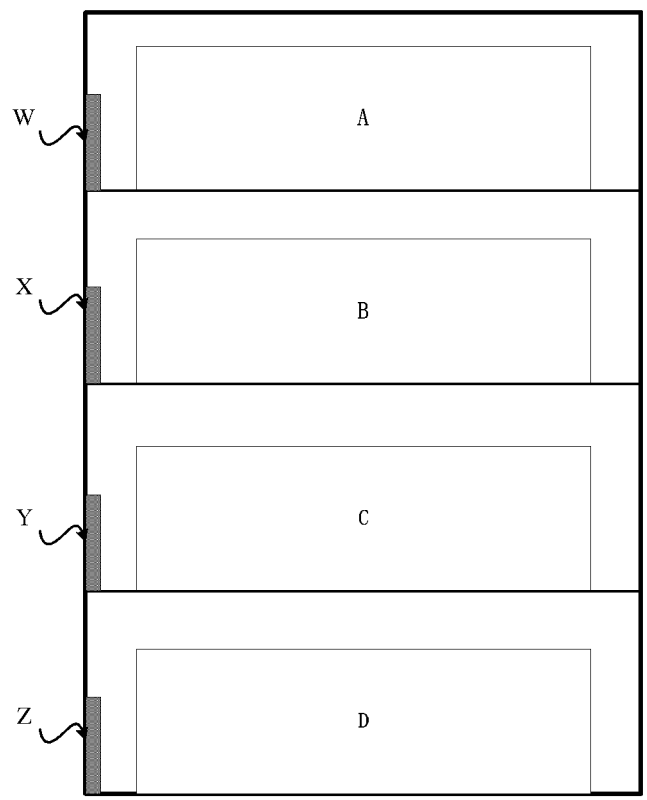
FIG. 2A shows a schematic elevation view of a rack housing a computer with a self-positioning function according to an embodiment of the present invention.
Figure 2B:
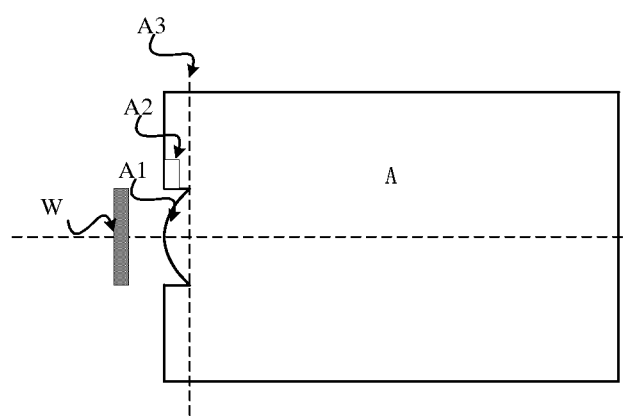
FIG. 2B shows a schematic top section view of computer A in FIG. 2A.

FIG. 2A shows a schematic elevation view of a rack housing a computer with a self-positioning function according to an embodiment of the present invention. The rack may be in compliance with a corresponding industrial standard, e.g., 19-inch rack standard, or designed according to self-defined specifications. The rack may be installed with a door or without a door, and the present invention has no limitation in this regard. FIG. 2A merely schematically illustrates a rack with four layers, and there are four computers A, B, C and D disposed on the rack. W, X, Y and Z are four tags attached on the side of the rack respectively, opposite to the sides of computers A, B, C and D, respectively. FIG. 2B shows a schematic top section view of computer A in FIG. 2A. As can be known from FIG. 2B, camera A1 is installed on the side of computer A opposite to tag W on the rack, and camera A1 is configured to read the contents of tag W attached on the side of the rack to identify the rack position where the computer is. The present invention has no limitation as to the side of the rack, which can be any side of the rack. According to an embodiment of the present invention, lighting device A2 may be installed around camera A1, wherein lighting device A2 is configured to provide light source for camera A1 when there is no sufficient light. According to another embodiment of the present invention, lighting device A2 may be installed on the rack, rather than on computer A.

In the example shown in FIG. 2A, camera A1 is installed on one side of the computer, the one side of computer A being opposite to one side of the rack, and the bottom side of the lens of camera A1 is parallel to the one side of computer A. In fact, the present invention has no limitation as to the side of the computer, which can be any side of the computer. For example, when the computer is a cuboid, said side of the computer can be any of the six sides of the computer.

According to an embodiment of the present invention, lighting device A2 is turned on before camera A1 reads the contents of tag W. For example, if camera A1 reads the contents of tag W every 24 hours, then a period before camera A1 reads tag W, lighting device A2 is turned on.

According to an embodiment of the present invention, before lighting device A2 is turned on, the light intensity around camera A1 is detected; only when the light intensity is not sufficient, lighting device A2 is turned on. In other embodiments, the light intensity around A1 may not be detected, and lighting device A2 is turned on for a long time.

The present invention has no limitation as to the nature of lighting device A2, which can be an LED (including white light LED, high power LED), electric incandescent lamp, and organic light-emitting diode lighting device (OLED lighting), etc.

According to an embodiment of the present invention, the turning on and off of lighting device A2 is controlled by software programming. According to another embodiment of the present invention, the turning on and off of the lighting device is realized by hardware logic programming. In order to reduce the cost of manual intervention, the turning on, off and even adjustment of the magnitude of the light source of lighting device A2 do not require manual intervention, and are performed completely automatically.

According to an embodiment of the present invention, camera A1 is directly integrated with the mainboard of computer A, and camera A1 is controlled by the software device. According to another embodiment of the present invention, camera A1 is directly integrated with the mainboard of computer A, and the control of camera A1 is realized by hardware logic programming on the mainboard. According to yet another embodiment of the present invention, camera A1 is not integrated with the mainboard of computer A, but is externally connected to computer A, and is connected with computer A through an interface (e.g., a USB port, etc.), so as to perform the transmission of control signals and data signals. The control signals include control signals for realizing the turning on and off of camera A1. The data signals include the contents of tag W read by camera A1.

As for the manner of alignment of the tag, there are various embodiments. In one embodiment, graduations are marked on the side of the rack, such that when tags are attached, they can be attached on corresponding positions along the specific graduations. In another embodiment, a card slot can be designed at the positions where the tags should be attached on the side of the rack, so that the tags can be attached at the specific positions on the side of the rack in the manner of gluing or securing by inserting into the card slot. In yet another embodiment, the side of the rack is not specifically limited, and redundant information of the tag is used, so that even if the contents of the tag are not totally aligned with the camera, the contents of the tag can still be read by the camera. The redundant information of the tag will be described in greater detail below.

In addition, the camera of the FIG. 2A is embedded, and the embedded camera may further facilitate outer packaging of the computer. According to another embodiment, the camera in the present invention can also be protruded from the side of the computer.

Figure 3A:
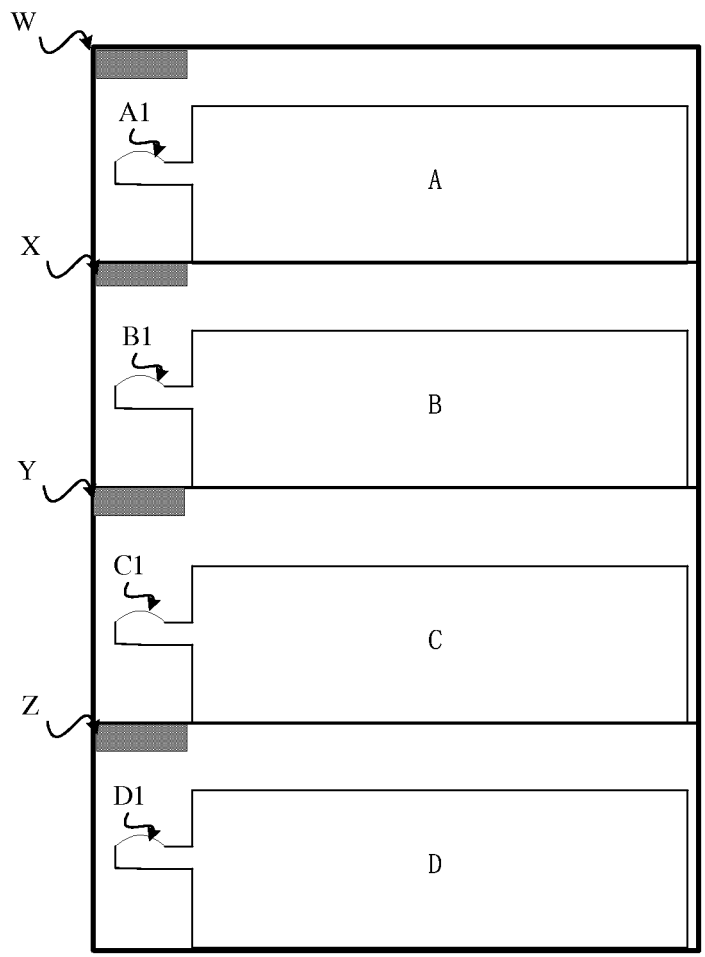
FIG. 3A shows a schematic elevation view of a rack housing a computer with a self-positioning function according to another embodiment of the present invention.
Figure 3B:
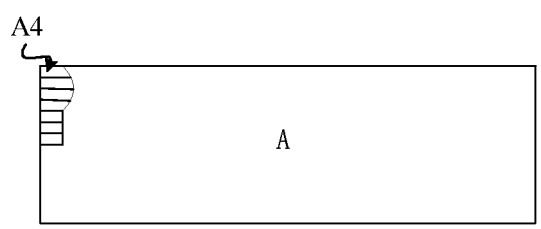
FIG. 3B shows a front section view of computer A in FIG. 3A.

FIG. 3A shows a schematic elevation view of a rack housing a computer with a self-positioning function according to another embodiment of the present invention. FIG. 3A differs from FIG. 2A in that, the lens of camera A1 in FIG. 3A is parallel to the plane of the pedestal of computer A. Optionally, in the example shown in FIG. 3A, a groove can be designed inside computer A, so that camera A1 can be withdrawn within computer A when it is not used. FIG. 3B shows an elevation section view of computer A in FIG. 3A, wherein the shaded portion shows the groove A4 of computer A for withdrawing of camera A1.

The present invention is not limited to the two designs shown in FIGS. 2A and 3A. The camera of the computer can be installed on any side or at any angle of the computer, as long as the camera can read the contents of the tags attached on the side of the rack.

Figure 4:
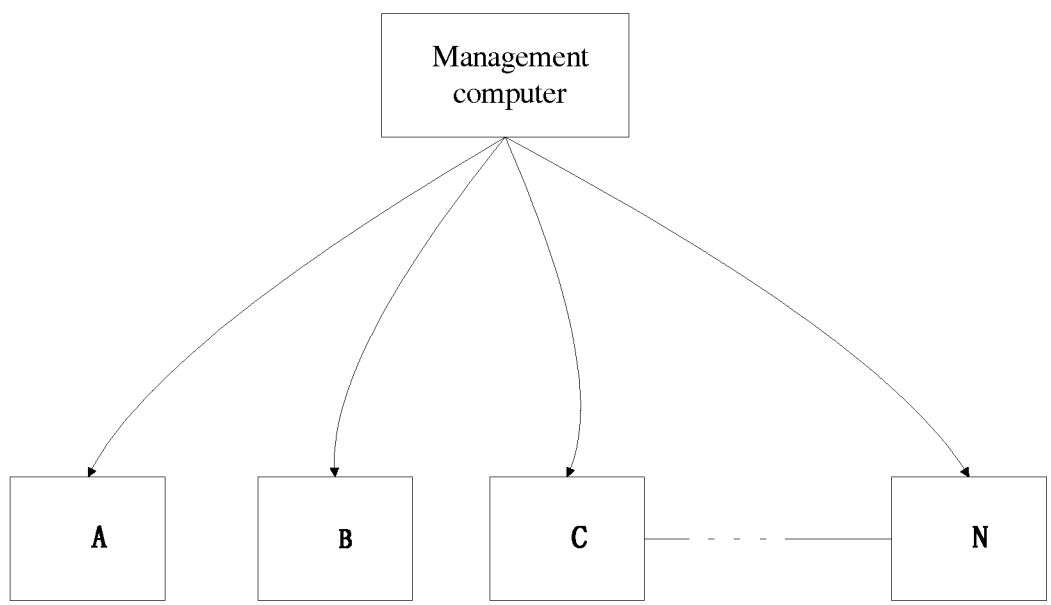
FIG. 4 shows a schematic view of a computer system in a data center according to an embodiment of the present invention.

FIG. 4 shows a schematic view of computer system in a data center according to an embodiment of the present invention. Computers A-N transfer the contents of the tags read by the cameras thereon and the identifications of the computers to a management computer. The management computer identifies the contents of each tag using the image recognition technology, parses the position information they represent and maintains the relationship of each computer and its position. The management computer may use any data structure, including table, database, etc., to maintain the relationship of the computer and the position thereof, and in the following a schematic description is given only by taking a table as an example. The advantage of the present invention lies in that there is no need to install image recognition software on each computer, and there is only need to install image recognition software on the management computer, thus reducing the software cost.

TABLE 1

| Computer ID | Position information |
|---|---|
| 1234567 | Rack # 5, Row # 2, Column # 7 |
| 2345678 | Rack # 5, Row # 3, Column # 7 |
| ... | ... |

As shown in the above Table 1, the first column records the identification codes of the computers, and the second column records the position information of the computers obtained by the image recognition and position parsing. If the contents in the tag have not further encoded the position information of the computer, but simply represent the position information of the computer by characters, digits or letters, e.g., "Rack #5", Row #2, Column #7", then the tag contents obtained by image recognition is "Rack #5", Row #2, Column #7", which can be directly stored in the second column of Table 1 without being parsed. As for encoding of the tag contents, description in greater detail will be given below.

According to another embodiment of the present invention, besides the computer identification and the position information, the management computer may further store the timestamp information thereon to identify the time for registering the position information of the computer. The time included in the timestamp information may be time information of a coarse granularity, e.g., including only year, month and day, or time information of a fine granularity, e.g., further including hour or even minute besides year, month and day. According to an example of the present invention, the table registered with the timestamp information is shown as in the following table 2:

TABLE 2

| Computer ID | Position information | Timestamp |
|---|---|---|
| 1234567 | Rack # 5, Row # 2, Column # 7 | 20110707 |
| 2345678 | Rack # 5, Row # 3, Column # 7 | 20110323 |
| ... | ... | ... |

Table 1 and table 2 only exemplarily show the stored computer identification and position information, and the computer identification and position information may be expressed in other manners according to application requirements under the present invention.

According to another embodiment of the present invention, the computer further performs image recognition on the contents of the tag read by the camera, and transmits the recognized contents to the management computer together with the identification of the computer. This requires installing the software for image recognition on each computer. The advantage of the embodiment is that the computer only transfers the recognized contents to the management computer, and the recognized contents may likely be text information, and thus the data traffic between the computer and the management computer is reduced.

According to an embodiment of the present invention, when the image recognition is performed, besides the contents of the tag, other parameters also need to be obtained. The other parameters refer to the parameters required for image recognition, including some parameters for camera imaging, such as, equivalent focal length, aperture size (focal length of the lens/diameter of the effective caliber of the lens), lens distortion correction coefficient, etc. For some low-cost cameras, the distortion of the image may be large in the marginal area of the vision; if it is not corrected, the image recognition effect may be affected. In some embodiments, the parameters are stored in the management firmware supporting the camera, and the parameters may be read into the image recognition module from the management firmware supporting the camera. Generally speaking, providing these parameters can help the subsequent image recognition and improve the accuracy of image recognition.

FIG. 5A shows a schematic view of using text information as tag contents according to an embodiment of the present invention. The position information "050207" denotes the fifth rack, the second row and the 7th column. The symbol "##" is a separator. When a tag is attached, if the contents of the tag are not correctly aligned with the lens of the camera, it will be difficult for the contents in the tag to be read by the camera completely. Therefore, in this embodiment, the contents in the tag must include certain redundant information, e.g., the position information "050207" is redundant for three times, thus four same pieces of position information appear in the tag. Two pieces of position information are separated by a separator, thus the camera can parse the position information of the computer no matter which piece of position information it has read.

FIG. 5B shows a schematic view of using one-dimensional code as tag contents according to another embodiment of the present invention. According to the embodiment shown in FIG. 5B, the position information needs to be encoded as one-dimensional code, which is then printed on the tag. Also, the one-dimensional code is redundant twice and printed on the tag, with two-dimensional codes being separated with a broken line as a separator of the redundant information.

FIG. 5C shows a schematic view of using two-dimensional code as tag contents according to yet another embodiment of the present invention. According to the embodiment shown in FIG. 5C, the position information needs to encoded as two-dimensional code, which is then printed on the tag. In the present embodiment, the two-dimensional code is redundant three times and printed on the tag, with two two-dimensional codes being separated with a blank as a separator of the redundant information.

The advantages of using one-dimensional code or two-dimensional code to encode the position information lies in the high accuracy of image recognition, and that more information can be included after the encoding, e.g., including information of the rack owner, functional region of the rack position, etc. FIGS. 5B and 5C merely schematically disclose two examples of code types, and the present invention may adopt other encoding manners.

Figure 6:
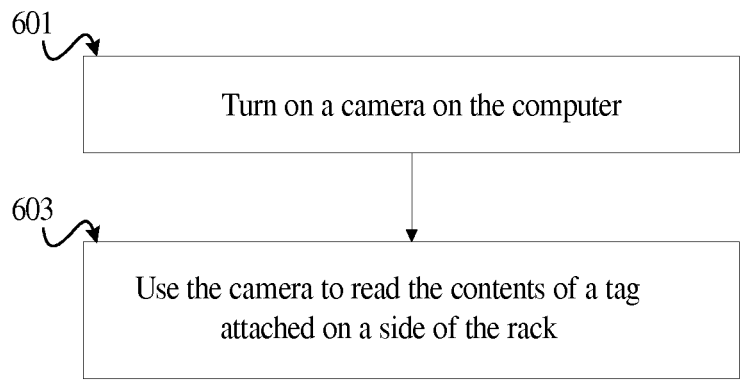
FIG. 6 shows a flowchart of a method for determining the position of a computer on a rack according to an embodiment of the present invention.

Under the same inventive concept of the present invention, FIG. 6 shows a flowchart of a method for determining the position of a computer on a rack according to an embodiment of the present invention. At step 601, a camera on the computer is turned on; at step 603, the camera is used to read the contents of a tag attached on a side of the rack in order to identify the rack position of the computer. The camera on the computer may be controlled by software or hardware logic programming, and it can be turned on as required or periodically. As for the installation manner and the installation position of the camera on the computer, the securing manner of the tag on the rack and the contents in the tag, as well as how to identify the contents in the tag, they have been described in great detail above, and are not repeated here.

Figure 7:
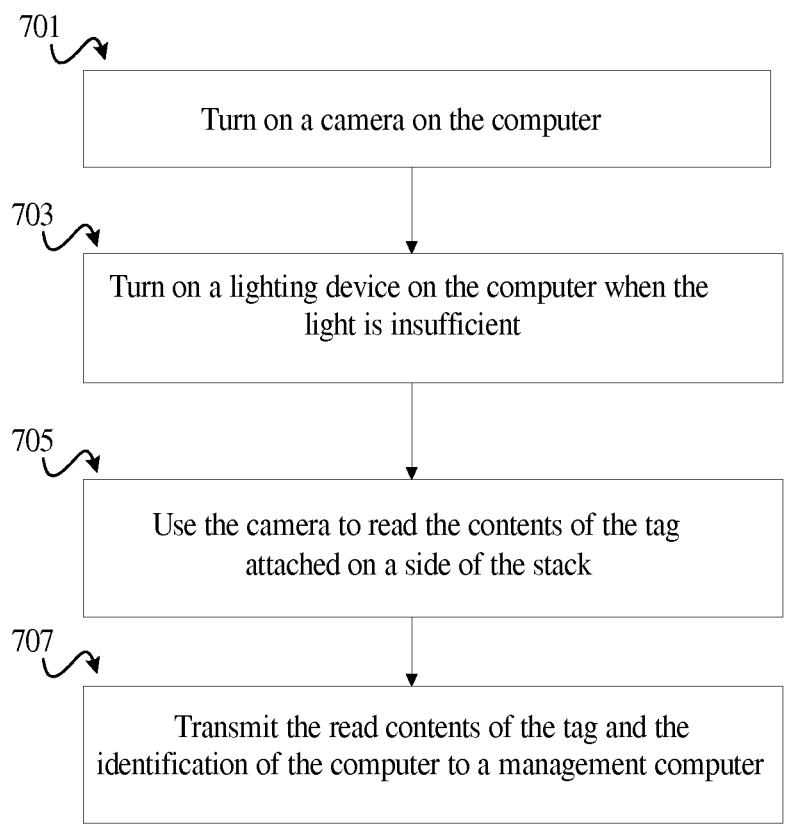
FIG. 7 shows a flowchart of a method for determining the position of a computer on a rack according to another embodiment of the present invention.

FIG. 7 shows a flowchart of a method for determining the position of a computer on a rack according to another embodiment of the present invention. A camera on the computer is turned on at step 701. At step 703, when the light is not sufficient, a lighting device on the computer is turned on to provide light for the camera. If there is sufficient light in the machine room, e.g., an electric incandescent lamp in the computer room is on, then the lighting device on the computer may not be turned on. Determining the light intensity may be performed by any light-sensitive device with sufficient sensitivity, e.g., a common home-use camera is typically equipped with such a light-sensitive device.

At step 705, the contents of the tag attached on a side of the rack is read by the camera. At step 707, the read contents of the tag and the identification of computer are transmitted to a management computer, which performs image recognition on the contents of the tag and parses the position information therein. Of course, the present invention is not limited to this implementation, rather the computer may perform the image recognition, and transmits the parsed position information and the identification of the computer to the management computer.

Optionally, the present invention further comprises the step of recording the timestamp of reading the contents of the tag. The timestamp records the time that the camera reads the contents of the tag, and recording the time stamp can be used for subsequent device management, the details of which can be referred to the description of FIG. 8 below.

Figure 8:
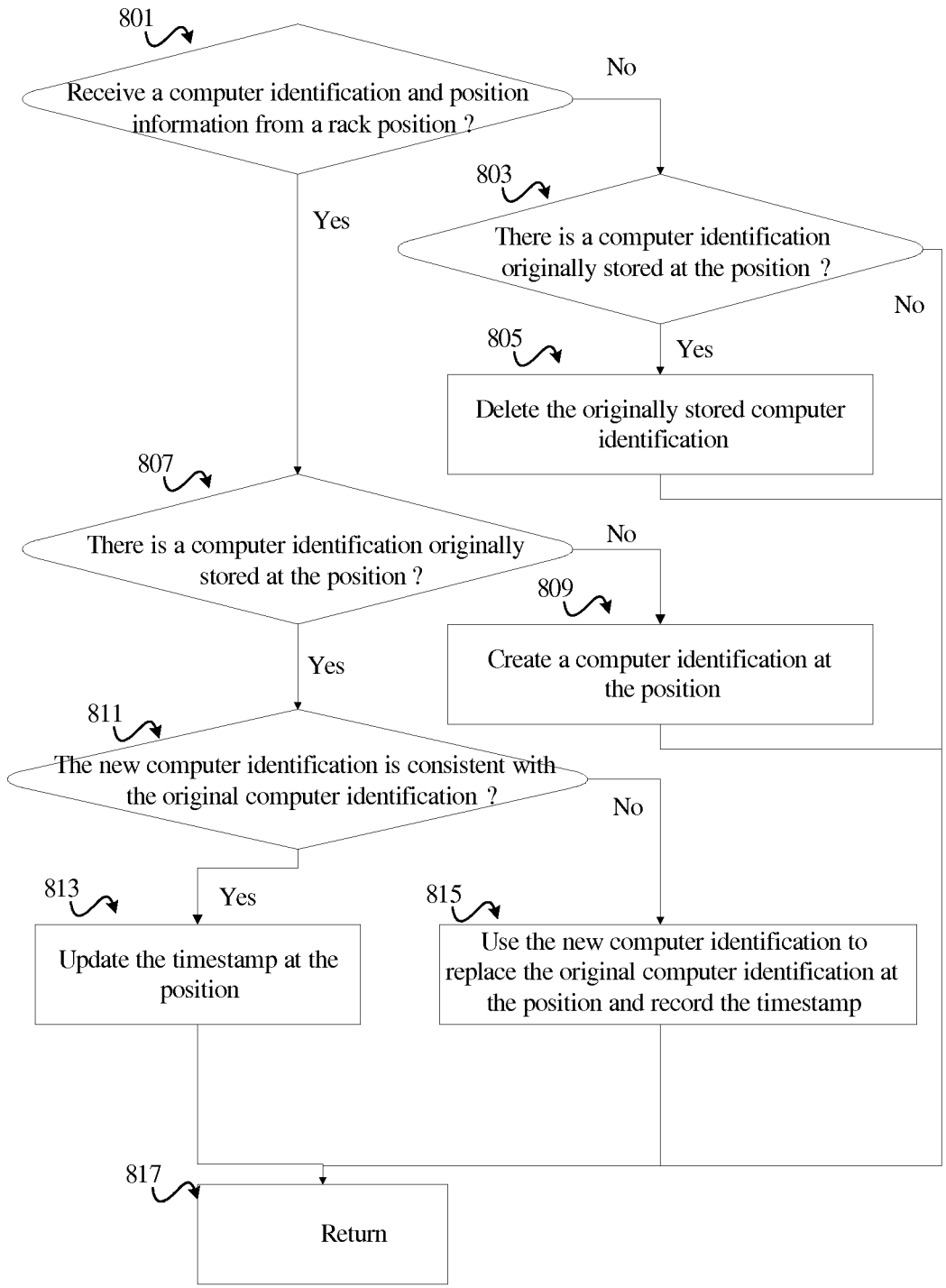
FIG. 8 shows a flowchart of a method for managing a computer's position according to an embodiment of the present invention.

FIG. 8 shows a flowchart of a method for managing a computer's position according to an embodiment of the present invention. At step 801, a computer identification and position information are received from some position of a rack. In the present embodiment, it is assumed that the computer has performed image recognition on the contents in the tag and transmits the parsed position information to the management computer. If the result of step 801 is yes, then it is determined whether there is a computer identification originally stored at the position at step 807. If the determination result is yes, then it is further determined whether the new computer identification is consistent with the original computer identification at step 811. If the further determination result is yes, this means that the computer originally registered at the position on the management computer has not changed, and according to an embodiment of the present invention, the timestamp information at the position can be updated at step 813, so as to use the updated time to replace the original registration time. Finally, the process returns at step 817.

If it is determined that the new computer identification is not consistent with the original computer identification at step 811, this means that the computer placed at the same position has changed. Then at step 815, the new computer identification is used to replace the original computer identification at the position and the timestamp is recorded, so as to accomplish update position management of the computer. Then, the process returns at step 817.

If at step 807, it is determined that there is no computer identification stored at the position, this means that a new computer has been placed at the position. Thus, at step 809, a computer identification is created at the position, e.g., re-creating one row of information in table 1 or table 2, or re-creating an item in a database. Thereafter, the process returns at step 817.

If at step 801 it is determined that no computer identification and position information is received from a position, e.g., when performing periodic reading of tag contents, no computer identification at a position is received, then at step 803, it is determined whether there is a computer identification originally stored at the position. If the determination result is yes, this means that a computer were originally placed at the position, and the computer has been removed. Then at step 805, the originally stored computer identification is deleted, e.g., deleting one row in a table, or an item in a database. And the process returns at step 817.

If at step 803, it is determined that there is no computer identification originally stored at the position, this means that the position was originally empty, and it is still empty. Thus there is no need to update the table or database in the computer, and the process may return directly at step 817.

FIG. 8 merely shows a flowchart of a method for managing a computer's position according to one embodiment of the present invention, and the present invention does not exclude other implementations.

Figure 9:
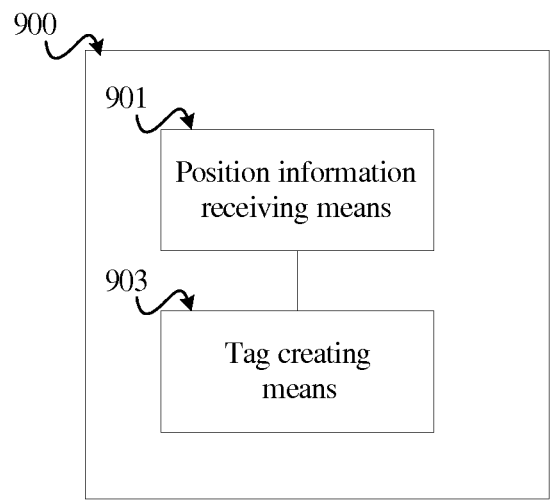
FIG. 9 shows a schematic view of a system for manufacturing a tag for determining a rack position according to an embodiment of the present invention.

FIG. 9 shows a schematic view of a system for manufacturing a tag for determining a rack position according to an embodiment of the present invention. The system 900 for manufacturing a tag for determining a rack position in FIG. 9 comprises position information receiving means 901 and tag creating means 903. The position information receiving means 901 is configured to receive input of the position information of at least one rack position, wherein the rack is for housing computers. The position information received by the information position receiving means 901 may come from manual input (e.g., manually inputting the position information "050207" in a table), or from automatic output of a program (e.g., the program automatically and sequentially outputs all the position information on the rack). The tag creating means 903 is configured to create a tag, based on the input position information, for identifying at least one rack position, wherein the tag is to be installed on one side of the rack so that a camera on the computer can read the contents on the tag to determine the rack position where the computer is. The tag creating means 903 may directly use the position information as the tag contents, or further encode the position information (e.g., encoding according to a one-dimensional code, or a two-dimensional code), and use the encoded information as the tag contents.

Figure 10:
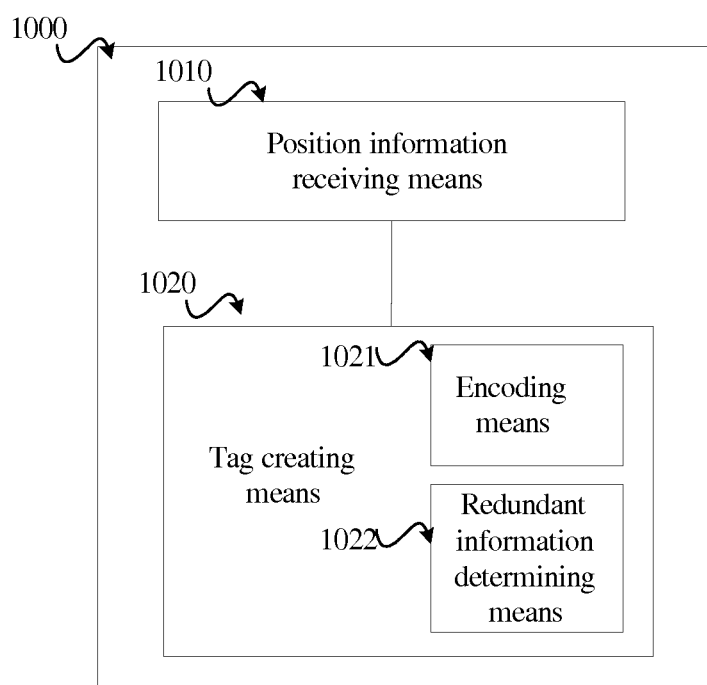
FIG. 10 shows a schematic view of a system for manufacturing a tag for determining a rack position according to another embodiment of the present invention.

FIG. 10 shows a schematic view of a system 1000 for manufacturing a tag for determining a rack position according to another embodiment of the present invention. The system of FIG. 10 comprises position information receiving means 1010, and tag creating means 1020, wherein the tag creating means 1020 further comprises encoding means 1021 and redundant information determining means 1022.

The position information receiving means 1010 is configured to receive input of the position information of at least one rack position.

According to an embodiment of the present invention, the tag creating means 1020 further comprises encoding means 1021 configured to encode the position information of the at least one rack position. The encoding may encode the rack position information as text information (e.g., encoding the position information "Rack #5, Row #2, Column #7" as the text information "050207" shown in FIG. 5A), one-dimensional encoding (e.g., encoding the position information as the one-dimensional code shown in FIG. 5B), two-dimension encoding (e.g., encoding the position information as the two-dimensional code shown in FIG. 5C), etc. Optionally, the encoding means 1021 further encodes the rack position information according to the user's selection of a code type, that is, allowing the user to customize the code type of the encoding.

According to an embodiment of the present invention, the tag creating means 1020 further comprises redundant information determining means 1022 configured to determine redundant information for the encoded position information, including the number and arrangement manner of the redundancy, wherein the number of redundancy refers to the number of times that the encoded position information is repeated, and the arrangement manner refers to how to arrange the redundant position information, the detailed contents of which have been described in great detail in the description of FIGS. 5A-5C, and are not repeated here.

According to an embodiment of the present invention, the system for manufacturing a tag for determining a rack position in FIG. 9 or 10 may be connected with a printing device, so that the tag of the related rack position can be printed.

Figure 11:
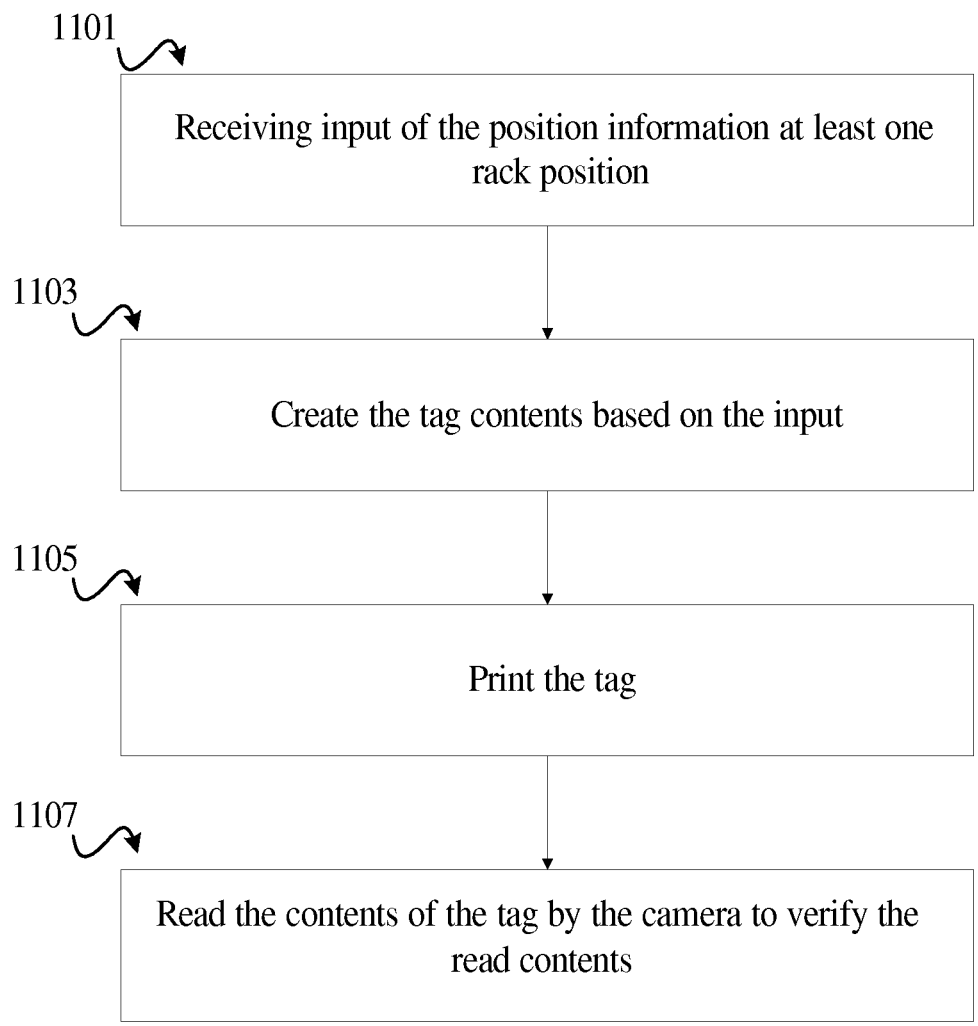
FIG. 11 shows a flowchart of a method for manufacturing a tag for determining a rack position according to an embodiment of the present invention.

FIG. 11 shows a flowchart of a method for manufacturing a tag for determining a rack position according to an embodiment of the present invention. The method of FIG. 11 and the system shown in FIG. 10 belong to two embodiments under the same inventive concept. Therefore, the same concepts and same features will not be repeated below.

At step 1101, input 1101 of the position information of at least one rack position is received. At step 1103, the contents of a tag are created based on the input. Optionally, step 1103 may further comprise encoding the position information and/or determining redundant information. At step 1105, the tag is printed. At step 1107, a camera reads the contents of the tag to verify the read contents. The verification comprises recognizing the read image; and optionally, if the recognized contents have been encoded, then the verification step further needs to parse the encoded information to recognize the position information represented therein. Thereafter, the verification step further comprises comparing the recognized position information with the position information input at step 1101 to verify whether the design of the tag is proper.

Various embodiments of the present invention may provide many advantages, including those listed in the summary of the invention and that can be deduced from the technical solutions. However, whether one embodiment possesses all the advantages, and whether such advantages are deemed as representing substantial improvement, do not constitute limitation to the present invention. In the meantime, the various embodiments described above are only for illustration, and those of ordinary skill in the art may make various variations and modifications to the above embodiments without departing from the substance of the present invention. The scope of the present invention is totally defined by the appended claims.

The invention claimed is:

1. A computer with a self-position determining function, the computer comprising:
  a camera installed on the computer, the camera being configured to read a contents of a tag attached on one side of a rack which houses the computer to identify a rack position where the computer is;
  wherein the computer is configured to transmit the contents of the tag read by the camera and an identification of the computer to a management computer; and
  wherein the camera is directly integrated with a mainboard of the computer.

2. The computer of claim 1, wherein the camera is installed on one side of the computer opposite to the one side of the rack, and a bottom side of a lens of the camera is parallel to the one side of the computer.

3. The computer of claim 1, the computer being further configured to perform image recognition on the contents of the tag read by the camera, and to transmit the recognized contents to the management computer together with the identification of the computer.

4. The computer of claim 1, further comprising a lighting device installed around the camera, wherein the lighting device is configured to provide a light source for the camera in a condition of insufficient light.

5. The computer of claim 1, wherein the contents of the tag include redundant information.

6. The computer of claim 1, wherein the camera is controlled by software.

7. The computer of claim 1, wherein the camera is controlled by hardware logic programming on the mainboard.

8. A computer program product for determining a position of a computer on a rack, the computer program product comprising:

a non-transitory storage device readable by a processor and storing instructions for operation by the processor for performing a method comprising:

turning on a camera on the computer;

using the camera to read a contents of a tag attached on one side of the rack which houses the computer to identify a rack position where the computer is; and transmitting the read contents of the tag and an identification of the computer to a management computer;

wherein the camera is directly integrated with a mainboard of the computer.

9. The computer program product of claim 8, wherein the method further comprises:

turning on a lighting device around the camera in a condition of insufficient light to provide a light source for the camera.

10. The computer program product of claim 8, wherein the method further comprises:

performing image recognition on the contents of the tag read by the camera, and transmitting the recognized contents with the identification of the computer to the management computer.

11. The computer program product of claim 8, wherein the method further comprises:

recording a timestamp of reading the contents of the tag.

12. The computer program product of claim 8, wherein the camera is controlled by software.

13. The computer program product of claim 8, wherein the camera is controlled by hardware logic programming on the mainboard.

* * * * *